United States Patent
Kotani et al.

(10) Patent No.: US 10,038,306 B2
(45) Date of Patent: Jul. 31, 2018

(54) NITRIDE SEMICONDUCTOR DEVICE AND QUANTUM CASCADE LASER USING THE SAME

(71) Applicants: Sharp Kabushiki Kaisha, Sakai, Osaka (JP); The University of Tokyo, Bunkyo-ku, Tokyo (JP)

(72) Inventors: Teruhisa Kotani, Sakai (JP); Yasuhiko Arakawa, Bunkyo-ku (JP)

(73) Assignees: Sharp Kabushiki Kaisha, Sakai (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/378,089

(22) Filed: Dec. 14, 2016

(65) Prior Publication Data

US 2017/0201072 A1   Jul. 13, 2017

(30) Foreign Application Priority Data

Jan. 13, 2016 (JP) .................. 2016-004333

(51) Int. Cl.
  *H01S 5/00* (2006.01)
  *H01S 5/34* (2006.01)
  (Continued)

(52) U.S. Cl.
  CPC ............ *H01S 5/3401* (2013.01); *H01L 33/16* (2013.01); *H01L 33/32* (2013.01); *H01S 5/3201* (2013.01); *H01S 5/3202* (2013.01); *H01S 5/3215* (2013.01); *H01S 5/3218* (2013.01); *H01S 5/3422* (2013.01); *H01S 5/34333* (2013.01); *H01S 5/0421* (2013.01); *H01S 5/305* (2013.01); *H01S 5/3407* (2013.01); *H01S 2301/173* (2013.01); *H01S 2302/02* (2013.01)

(58) Field of Classification Search
  CPC .... H01S 5/3401; H01S 5/3218; H01S 5/3215; H01S 5/3202; H01S 5/34333
  See application file for complete search history.

(56) References Cited

U.S. PATENT DOCUMENTS

2008/0035908 A1   2/2008 Sakai
2008/0308815 A1   12/2008 Kasai et al.
(Continued)

FOREIGN PATENT DOCUMENTS

JP   2005-322944 A   11/2005
JP   2006-173581 A   6/2006
(Continued)

OTHER PUBLICATIONS

Okamoto et al., "Dislocation-Free m-Plane InGaN/GaN Light-Emitting Diodes on m-Plane GaN Single Crystals", Japanese Journal of Applied Physics, vol. 45, No. 45, 2006, pp. L1197-L1199.

*Primary Examiner* — Yuanda Zhang
(74) *Attorney, Agent, or Firm* — Keating & Bennett, LLP

(57) ABSTRACT

A nitride semiconductor device includes a GaN substrate in which an angle between a principal surface and an m-plane of GaN is −5° or more and +5° or less, a first intermediate layer disposed on the principal surface of the substrate and made of $Al_zGa_{(1-z)}N$, $0 \le z \le 1$, and a second intermediate layer disposed on a principal surface of the first intermediate layer, having an Al content different from that of the first intermediate layer, and made of $Al_{x1}In_{y1}Ga_{(1-x1-y1)}N$, $0 \le x1 \le 1$, $0 \le y1 \le 1$. A quantum cascade laser includes the nitride semiconductor device.

13 Claims, 5 Drawing Sheets

(51) Int. Cl.
    *H01S 5/32*      (2006.01)
    *H01S 5/343*      (2006.01)
    *H01L 33/16*      (2010.01)
    *H01L 33/32*      (2010.01)
    *H01S 5/042*      (2006.01)
    *H01S 5/30*      (2006.01)

(56) References Cited

U.S. PATENT DOCUMENTS

| | | |
|---|---|---|
| 2009/0238227 A1 | 9/2009 | Kubota et al. |
| 2012/0001223 A1* | 1/2012 | Inoue ............... H01L 33/14 257/103 |
| 2012/0049156 A1 | 3/2012 | Ohta et al. |
| 2012/0114002 A1 | 5/2012 | Enya et al. |
| 2016/0064901 A1* | 3/2016 | Terashima ............ H01S 5/042 372/4 |
| 2017/0201071 A1 | 7/2017 | Kotani et al. |

FOREIGN PATENT DOCUMENTS

| | | | |
|---|---|---|---|
| JP | 2006-351640 A | 12/2006 | |
| JP | 2006351640 A * | 12/2006 | ............ H01L 33/00 |
| JP | 2008-277539 A | 11/2008 | |
| JP | 2009-018983 A | 1/2009 | |
| JP | 2010-263162 A | 11/2010 | |
| JP | 2012-049337 A | 3/2012 | |
| WO | 2015/186462 A1 | 12/2015 | |

\* cited by examiner

FIG.1
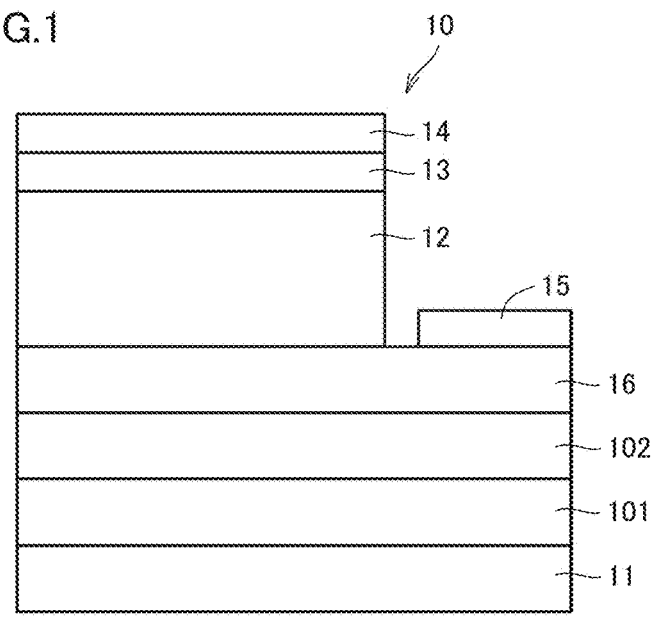
FIG.2  1μm × 1μm
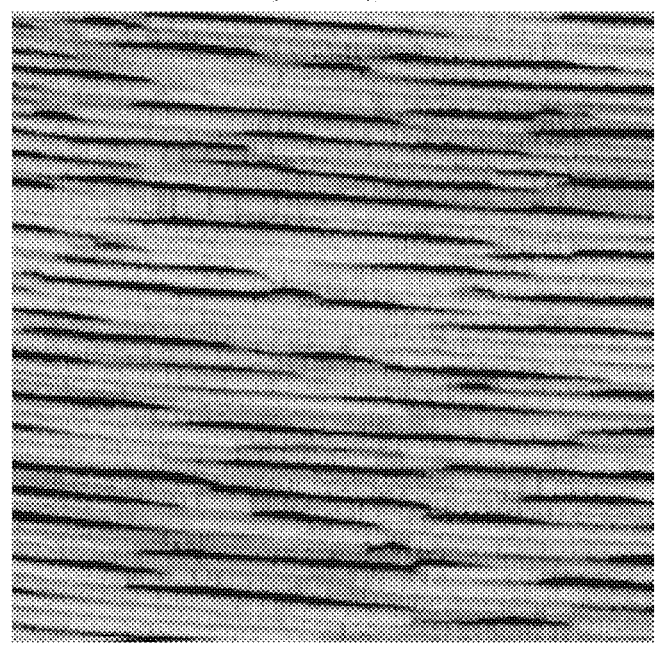
c-AXIS DIRECTION
a-AXIS DIRECTION

NITRIDE SEMICONDUCTOR DEVICE AND QUANTUM CASCADE LASER USING THE SAME

BACKGROUND

1. Field

The present disclosure relates to a nitride semiconductor device and a quantum cascade laser using the nitride semiconductor device.

2. Description of the Related Art

Light emitting diodes (LEDs) and laser diodes (LDs) serving as semiconductor light emitting devices that use a nitride semiconductor are used for illuminating devices, display devices, optical recording devices, and the like. Furthermore, electronic devices that use a nitride semiconductor are used for high-frequency devices and power devices. Quantum cascade lasers (QCLs) are promising for next-generation terahertz light sources.

In mass-produced nitride semiconductor devices, layers are formed on a c-plane ((0001) plane) serving as a principal surface. However, since the c-plane is obtained by alternately stacking Ga layers and N layers, polarization occurs in a growth direction. If polarization discontinuity arises because of heterojunction, charges are induced at heterointerfaces. The generation of an internal electric field due to the charges causes band bending.

The band bending is known to adversely affect device characteristics. For example, the band bending causes separation of electrons and holes in light emitting devices and exhibits normally-on characteristics in electronic devices. In devices, such as quantum cascade lasers, in which a plurality of subbands are coupled with each other, band bending considerably complicates the design of subbands or increases the susceptibility to production error.

An m-plane ({1-100} plane) known as a nonpolar plane is a-plane perpendicular to the c-plane. Ga and N are present on the principal surface with the same number, and therefore polarization is not generated in a direction of the normal to the m-plane. As a result, the above-described band bending does not occur. Accordingly, the m-plane is believed to be suitable for light emitting devices and electronic devices, and thus has been mainly used for light emitting devices including an active layer made of InGaN (e.g., refer to Okamoto Kuniyoshi, Ohta Hiroaki, Nakagawa Daisuke, Sonobe Masayuki, Ichikawa Jun, Takasu Hidemi, "Dislocation-Free m-Plane InGaN/GaN Light-Emitting Diodes on m-Plane GaN Single Crystals", Japanese Journal of Applied Physics, 45, L1197 (Non-Patent Document 1)).

An InGaN quantum well structure is suitable for visible light devices because the band gap corresponds to a wavelength longer than the wavelength of blue light. A quantum well structure in which a GaN quantum well layer is sandwiched by AlGaN, which has a larger band gap than GaN, has received attention for use in ultraviolet light devices and intersubband transition devices in an infrared to terahertz range. AlGaN has a smaller lattice constant than GaN. In the case where the AlGaN is subjected to coherent growth on a GaN substrate, when stress in a film reaches its limit as a result of exceeding the critical thickness of the film, defects are introduced, which causes lattice relaxation of the AlGaN. If cracks are formed in a layer (e.g., an active layer) that exhibits device characteristics as a result of lattice relaxation, the device is electrically divided. This causes nonuniform light emission in optical devices and conduction failure in electronic devices. The axes perpendicular to each other in an in-plane direction of a principal surface of an m-plane are a c-axis (<0001>) and an a-axis (<11-20>). Different lattice constants are present in the in-plane direction of the principal surface, and thus AlGaN has strain anisotropy in the in-plane direction. A c-plane substrate used for known LEDs and the like does not include a c-axis in its principal surface and includes only an a-axis. The following has been found from the experiment conducted by the present inventors. When a thick AlGaN layer (about 1 μm) is grown on GaN, hexagonal cracks are formed in the AlGaN on a c-plane substrate, but cracks extending parallel to the a-axis, that is, linear cracks extending along the c-plane are often formed in the AlGaN on the m-plane substrate. In other words, the crack formation mechanism differs between the m-plane substrate and the c-plane substrate.

Japanese Unexamined Patent Application Publication No. 2008-277539 (Patent Document 1) discloses a method for suppressing the formation of cracks in AlGaN on an m-plane GaN substrate. In the method, an AlGaN layer having an Al content of 0.05 or more and a thickness of 500 nm or more is formed on the m-plane GaN substrate. According to the inventors in Patent Document 1, when an AlGaN layer having an Al content of 0.05 or more and a thickness of 500 nm or more is grown, microscopic lattice relaxation on a c-plane, which is a slip plane, occurs in the AlGaN layer. This allows lattice relaxation of the AlGaN without forming cracks. Furthermore, when the AlGaN layer has an Al content of 0.1 to 1.0 and a thickness of 2 μm or more, large strain is contained, but the AlGaN layer is not relaxed as a result of the formation of cracks.

However, it has been found from the experiment conducted by the present inventors that when an AlGaN layer having an Al content of 0.2 and a thickness of 1.2 μm, which is an example of the above configuration, is grown on an m-plane GaN substrate, lattice relaxation due to cracks occurs under some growth conditions, which makes it difficult to produce a device.

SUMMARY

Accordingly, it is desirable to provide a nitride semiconductor device in which the formation of cracks in an AlGaN layer grown on an m-plane GaN substrate can be suppressed.

According to an aspect of the disclosure, there is provided a nitride semiconductor device including a GaN substrate in which an angle between a principal surface and an m-plane of GaN is −5° or more and +5° or less, a first intermediate layer disposed on the principal surface of the substrate and made of $Al_zGa_{(1-z)}N$, $0 \leq z \leq 1$, and a second intermediate layer disposed on a principal surface of the first intermediate layer, having an Al content different from that of the first intermediate layer, and made of $Al_{x1}In_{y1}Ga_{(1-x1-y1)}N$, $0 \leq x1 \leq 1$, $0 \leq y1 \leq 1$.

According to another aspect of the disclosure, there is provided a quantum cascade laser including the above-described nitride semiconductor device.

BRIEF DESCRIPTION OF THE DRAWINGS

FIG. 1 schematically illustrates a structure of a QCL according to a first embodiment of the present disclosure.

FIG. 2 illustrates a grain-shaped surface morphology of a first intermediate layer.

DESCRIPTION OF THE EMBODIMENTS

Figure 3A:
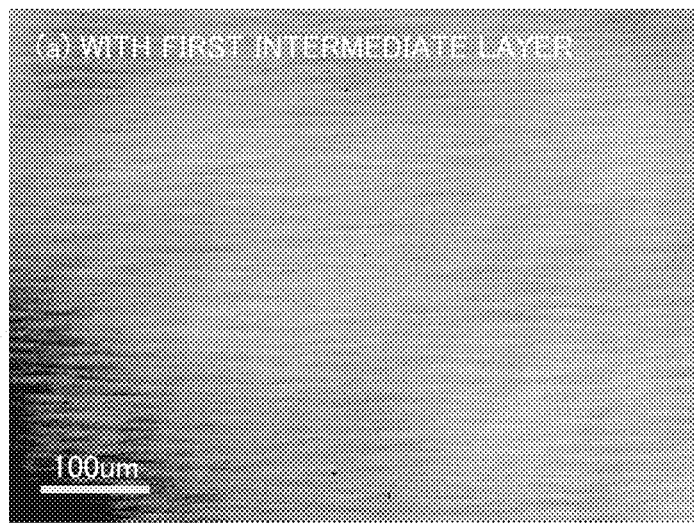
FIG. 3A is an optical microscope image of a surface of a second intermediate layer formed on a first intermediate layer.

Hereafter, the present disclosure will be described with reference to the attached drawings. Although quantum cascade lasers (QCLs) will be described below as an example of nitride semiconductor devices, the present disclosure is not limited to the QCLs. In the present disclosure, QCLs having high light emitting efficiency without active layer cracks can be achieved. In the drawings of the present disclosure, the same reference numerals denote the same parts or the corresponding parts. The dimensions such as length, width, thickness, and depth are appropriately changed to clarify and simplify the drawings, and do not correspond to the actual dimensions.

First Embodiment

Structure of QCL

FIG. 1 is a sectional view of a QCL 10 according to a first embodiment of the present disclosure. The QCL 10 includes a substrate 11, a first intermediate layer 101 disposed on the upper surface of the substrate 11, a second intermediate layer 102 disposed on the upper surface of the first intermediate layer 101, a first contact layer 16 disposed on the upper surface of the second intermediate layer 102, an active layer 12 disposed on the first contact layer 16, a second contact layer 13 disposed on the upper surface of the active layer 12, an upper electrode (second electrode) 14 in contact with the upper surface of the second contact layer 13, and a lower electrode 15 disposed on the first contact layer 16 in a position different from that of the active layer 12. The active layer 12 includes two or more active layer units stacked on top of each other. Each of the active layer units includes one or more quantum well layers and one or more barrier layers, and each of the quantum well layers and each of the barrier layers are alternately stacked.

The active layer 12 and the second contact layer 13 are etched so that the QCL 10 has a mesa shape with a width of, for example, 100 μm. Thus, a waveguide is formed. Herein, a part of the first contact layer 16 may be etched. The width of the waveguide may be changed in accordance with the use of the QCL 10. The width "100 μm" is merely an example of the width of a waveguide that allows single-mode oscillation of electromagnetic waves in the terahertz range.

The QCL according to an embodiment of the present disclosure is a nitride semiconductor device that includes a GaN substrate in which the angle between the surface and the m-plane of GaN is −5° or more and +5° or less, a first intermediate layer disposed on the principal surface of the substrate and made of $Al_zGa_{(1-z)}N$, $0 \leq z \leq 1$, and a second intermediate layer disposed on the principal surface of the first intermediate layer, having an Al content different from that of the first intermediate layer, and made of $Al_{x1}In_{y1}Ga_{(1-x1-y1)}N$, $0 \leq x1 \leq 1$, $0 \leq y1 \leq 1$. In the QCL according to an embodiment of the present disclosure, formation of cracks on the surface of the second intermediate layer can be suppressed.

Substrate

The substrate 11 is made of GaN. The substrate 11 may be an m-plane free-standing GaN substrate polished after being cut so that the upper surface of the substrate has a (1-100) orientation. Thus, an AlGaN/GaN-based MQW structure having good crystal quality can be grown. The substrate 11 may also be an m-plane free-standing GaN substrate polished after being cut so that the upper surface of the substrate has an off-angle of ±5° with respect to a (1-100) orientation. Also in this case, the present inventors have confirmed that an AlGaN/GaN-based MQW structure having good crystal quality can be grown. The (1-100) plane is merely an example, and the upper surface of the substrate may have a so-called {1-100} plane, such as a (10-10) plane, as long as the plane is equivalent to the (1-100) plane.

The substrate 11 indicates a wafer supplied for typical epitaxial growth. The substrate 11 also includes, by definition, a template in which a GaN thin film (buffer layer) is homoepitaxially grown on the principal surface of the substrate 11 by MBE or MOCVD described below to expose GaN on the principal surface in order to improve the surface flatness and impurity concentration of the substrate 11.

First Intermediate Layer

The first intermediate layer 101 is made of a compound semiconductor. The first intermediate layer 101 may be a layer in which the content z1 in general formula $Al_{z1}Ga_{(1-z1)}N$, $0 \leq z1 \leq 1$ is substantially constant. The Al content z1 of the first intermediate layer 101 may be higher than the Al content x1 of a second intermediate layer 102 described below, such as z1 =1 (i.e., AlN). In the case where AlGaN is directly grown on the GaN substrate, first, AlGaN is grown in a strained state in accordance with the lattice constant of GaN. The strain becomes larger as the thickness of the AlGaN layer increases. When the strain reaches its limit, defects are introduced, which causes lattice relaxation.

By controlling the growth conditions of the first intermediate layer 101, the first intermediate layer 101 sometimes has a grain (island)-shaped surface morphology. In this grain shape, the growth shape in an in-plane direction is not a substantially isotropic shape such as a substantially hexagonal or circular shape unlike grain growth used for c-plane nitride semiconductor growth on sapphire, and the length of grains in the c-axis direction may be smaller than that in the a-axis direction. FIG. 2 illustrates an example of a desirable surface morphology. FIG. 2 illustrates a surface morphology obtained when AlN serving as a first intermediate layer is grown on GaN. As illustrated in FIG. 2, the grains have an a-axis larger than a c-axis.

The reason for this is that a strain application mechanism and a strain relaxation mechanism are different between the a-axis direction and the c-axis direction. When AlGaN on an m-plane GaN substrate is subjected to coherent growth, a larger strain is exerted in the c-axis direction than in the a-axis direction. This is because the lattice constant difference on the c-axis is larger than that on the a-axis. In the c-axis direction of the second intermediate layer 102, strain relaxation occurs as a result of the introduction of defects at the grain boundaries of the first intermediate layer 101. In the a-axis direction, the present inventors have found from their experiments that strain relaxation occurs not at the interfaces of the first intermediate layer, but occurs as a result of formation of voids (hollows) due to cracks of the first intermediate layer. Therefore, grain boundaries at which relaxation occurs may be provided in the c-axis direction, and a continuous film structure may be formed as much as possible in the a-axis direction. As described below, the present inventors have found from their experiments that the thickness of the first intermediate layer 101 affects strain present inside the second intermediate layer 102.

Second Intermediate Layer

The second intermediate layer 102 is made of a compound semiconductor. The compound semiconductor is preferably represented by general formula $Al_{x1}In_{y1}Ga_{(1-x1-y1)}N$, $0 \leq x1 \leq 1$, $0 \leq y1 \leq 1$ and is more preferably determined so as to have a lattice constant larger than that of the first intermediate layer 101. For example, when the first intermediate layer 101 has a composition of AlN, the second intermediate layer 102 may have a lattice constant between $Al_{0.05}Ga_{0.95}N$ and $Al_{0.99}Ga_{0.01}N$.

When cracks are formed in the first intermediate layer 101, the second intermediate layer 102 plays a role of covering the cracks to form a flat surface and thus has such a sufficient thickness that the cracks are completely covered.

Figure 3B:
FIG. 3B is an optical microscope image of a surface of a second intermediate layer formed without forming a first intermediate layer.

FIGS. 3A and 3B illustrate the experimental results concerning the first intermediate layer 101 and the second intermediate layer 102. FIG. 3A is an optical microscope image obtained when a first intermediate layer 101 having the surface structure illustrated in FIG. 2, having a thickness of 12 nm, and made of AlN is formed on an m-plane GaN substrate, and a second intermediate layer 102 having a thickness of about 1.2 μm is grown so as to satisfy x1=0.2 and y1=0 ($Al_{0.2}Ga_{0.8}N$). FIG. 3B is an optical microscope image obtained when a first intermediate layer 101 is not formed and a second intermediate layer 102 having a thickness of about 1.2 μm is directly grown on an m-plane GaN substrate so as to satisfy x1=0.2 and y1=0 ($Al_{0.2}Ga_{0.8}N$).

As is clear from FIG. 3B, when the first intermediate layer 101 is not formed, many cracks are formed on the surface. In contrast, as is clear from FIG. 3A, when the first intermediate layer 101 is formed, formation of cracks is inhibited and a flat surface is provided. That is, the presence of the first intermediate layer 101 inhibits the formation of cracks.

Influence of First Intermediate Layer on Second Intermediate Layer

Figure 4:
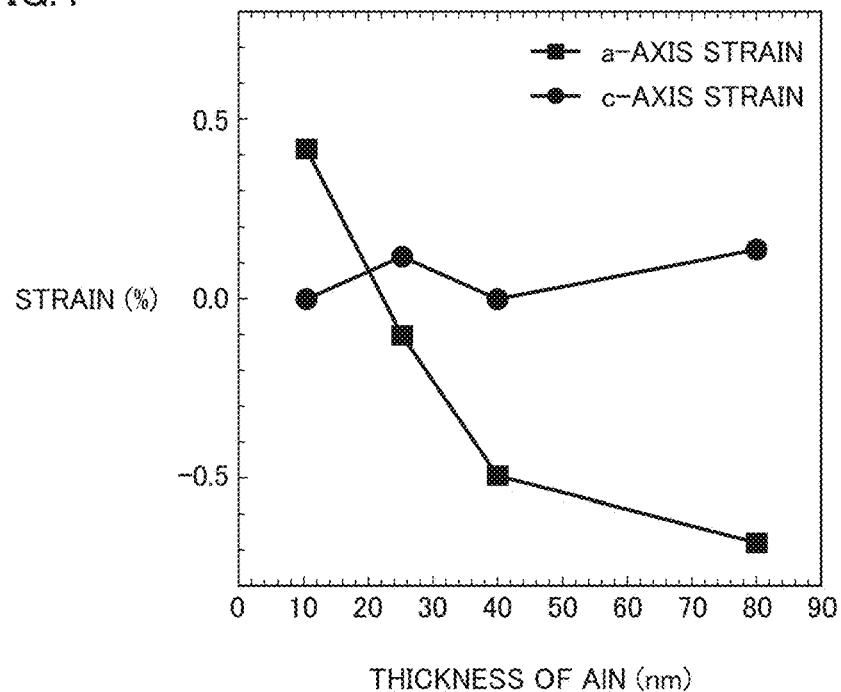
FIG. 4 is a graph illustrating strain present inside the second intermediate layer.

The Influence of the first intermediate layer 101 on the second intermediate layer 102 will be described. As described above, the first intermediate layer 101 plays a role of controlling strain present inside the second intermediate layer 102. FIG. 4 is a graph illustrating the relationship between the thickness of the first intermediate layer 101 and the strain present inside the second intermediate layer 102. The relationship is obtained when AlN grown so as to have the surface morphology in FIG. 2 is used as the first intermediate layer 101. In FIG. 4, the vertical axis shows strain (%) and the horizontal axis shows the thickness (nm) of AlN. The a-axis strain and the c-axis strain of the second intermediate layer 102 are measured by reciprocal space mapping.

As is clear from FIG. 4, when the thickness of the first intermediate layer 101 is increased, the strain of the second intermediate layer 102 in the a-axis direction is decreased from a state coherent to GaN. It has been found from the experiment conducted by the present inventors that when the thickness of AlN serving as the first intermediate layer 101 is 25 nm or more, cracks are formed on the surface of the AlN in a direction parallel to the c-axis. Furthermore, the second intermediate layer 102 is grown so as to cover voids formed as a result of formation of the cracks. In other words, relaxation occurs at the cracks in the a-axis direction. As the thickness of the AlN serving as the first intermediate layer 101 increases, the a-axis lattice constant reaches to an a-axis lattice constant intrinsic to AlN through the strain relaxation, and the a-axis lattice constant on the surface of the first intermediate layer 101 decreases. That is, the strain present inside the second intermediate layer 102 in the a-axis direction decreases.

In the c-axis direction of the second intermediate layer 102, as described above, lattice relaxation occurs at the grain boundaries of the first intermediate layer 101. It has been found from the experiment conducted by the present inventors that when AlN is grown as the first intermediate layer 101 without forming grains, relaxation due to cracks occurs in the c-axis direction. The grain size illustrated in FIG. 2 is sufficiently small for the relaxation of the second intermediate layer 102 in the c-axis direction. Therefore, as illustrated in FIG. 4, relaxation in the c-axis direction occurs regardless of the thickness of the first intermediate layer 101.

The thickness of the first intermediate layer 101 in the first embodiment is preferably 100 nm or less. When the first intermediate layer 101 has a thickness of 100 nm or less, strain present, in the a-axis direction, inside the second intermediate layer 102 made of AlGaN with an Al content of about 0.2 can be suppressed. The thickness of the first intermediate layer 101 in the first embodiment is more preferably 5 nm or more and 40 nm or less. As is clear from FIG. 4, when the thickness of the first intermediate layer 101 is 40 nm or less, the strain in the a-axis direction can be decreased to ±0.5%. It has been also found from the experiment conducted by the present inventors that when the thickness of the first intermediate layer 101 is less than 5 nm, grains illustrated in FIG. 2 are not formed and sufficient strain relaxation does not occur. That is, when the thickness of the first intermediate layer 101 is 5 nm or more and 40 nm or less, the strain present, in the a-axis direction, inside the second intermediate layer 102 made of AlGaN with an Al content of about 0.2 can be decreased to substantially zero. This allows formation of the second intermediate layer 102 made of $Al_{0.20}Ga_{0.80}N$ with a small strain in the a-axis direction. Consequently, a thick layer having a smaller lattice constant than the substrate 11 can be formed on the second intermediate layer 102.

Active Layer

Quantum Well Layer

The quantum well layer of the active layer 12 is made of a compound semiconductor. The compound semiconductor is preferably represented by general formula $Al_{a1}In_{b1}Ga_{(1-a1-b1)}N$, $0 \leq a1 \leq 1$, $0 \leq b1 \leq 1$ and is more preferably GaN. By using GaN, which is a binary crystal, alloy scattering that causes nonradiative transition can be suppressed.

The thickness of the quantum well layer is preferably 1 nm or more and 100 nm or less and more preferably 1 nm or more and 6.5 nm or less. Thus, optical gain due to intersubband transition can be obtained.

The quantum well layers of each of the active layer units may have the same thickness or different thicknesses. For example, the thickness of the quantum well layer constituting an upper lasing level is preferably 1 nm or more and 7 nm or less and more preferably 1.5 nm or more and 3.5 nm or less. The thickness of the quantum well layer constituting a lower lasing level is preferably 1 nm or more and 7 nm or less and more preferably 1.5 nm or more and 3.5 nm or less. The thickness of the quantum well layer constituting a carrier-extraction level is preferably 1 nm or more and 20 nm or less and more preferably 4 nm or more and 12 nm or less.

The principal surface of the quantum well layer (the surface of the quantum well layer on which the barrier layer is formed) has a (1-100) orientation. Thus, the internal electric field is decreased to a negligible degree in the QCL 10, and the crystal growth is easily performed. This makes it easy to design the QCL 10. Herein, the present inventors have confirmed that even when the principal surface of the quantum well layer has an off-angle of ±5° with respect to a (1-100) orientation, the internal electric field can be decreased to a negligible degree in the QCL 10, and the crystal growth is easily performed.

Barrier Layer

The barrier layer of the active layer 12 may be represented by general formula $Al_{a2}In_{b2}Ga_{(1-a2-b2)}N$, $0 \leq a2 \leq 1$, $0 \leq b2 \leq 1$. The barrier layer may have a higher band gap energy than the quantum well layer. Therefore, when the quantum well layer is made of GaN, the barrier layer is desirably made of AlGaN.

The thickness of the barrier layer is preferably 1 nm or more and 10 nm or less and more preferably 1.8 nm or more and 6.5 nm or less. This provides optical gain due to intersubband transition.

In the present disclosure, at least one of the barrier layers preferably has a thickness of 1.8 nm or more. This inhibits nonradiative transition of carriers to a different level due to elastic scattering (e.g., impurity scattering or roughness scattering). Therefore, the lasing at room temperature can be further stabilized. More preferably, all the barrier layers included in the active layer 12 have a thickness of 1.8 nm or more. This further inhibits nonradiative transition of carriers to a different level due to elastic scattering, and thus the lasing at room temperature can be further stabilized.

Figure 5:
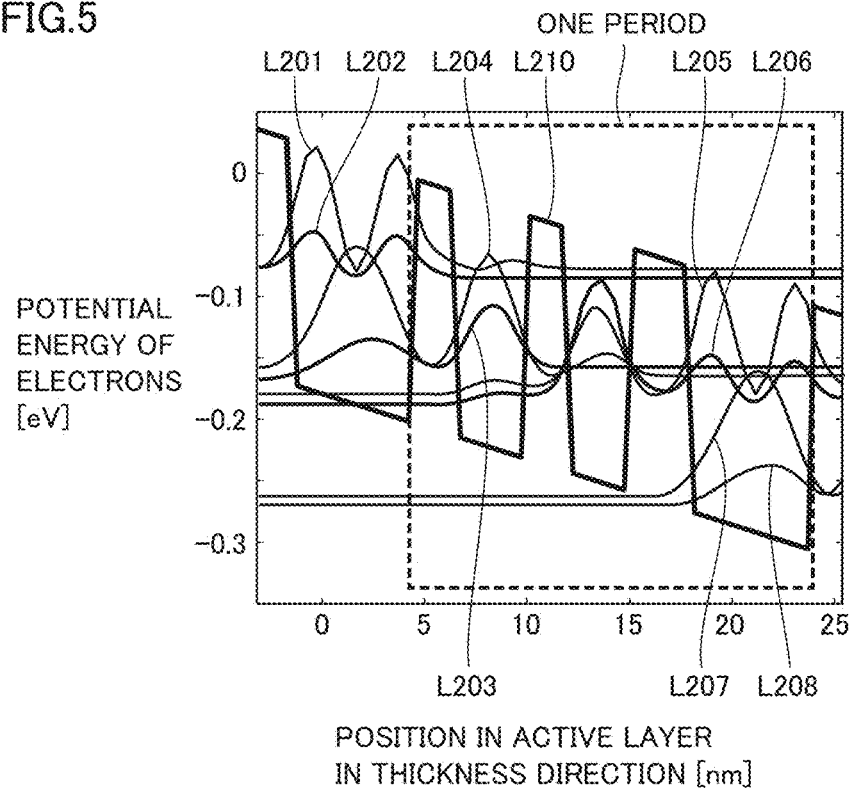
FIG. 5 illustrates a band structure and a wave function of the QCL.

More preferably, the barrier layer having a thickness of 1.8 nm or more is disposed between the quantum well layer constituting the upper lasing level and the quantum well layer constituting the lower lasing level. This decreases the overlap between the wave function of the upper lasing level and the wave function of the lower lasing level (FIG. 5 below). Therefore, the nonradiative transition (nonradiative transition due to elastic scattering such as impurity scattering or roughness scattering) from the upper lasing level to the lower lasing level can be inhibited. However, an excessive decrease in the overlap between the wave function of the upper lasing level and the wave function of the lower lasing level because of a large thickness of the barrier layer makes it difficult to efficiently cause stimulated emission. Therefore, the thickness of the barrier layer is controlled to an appropriate thickness. By controlling the thickness of the barrier layer to an appropriate thickness, the lasing at room temperature can be further stabilized. More preferably, a barrier layer having a thickness of 1.8 nm or more and 3.0 nm or less is disposed between the quantum well layer constituting the upper lasing level and the quantum well layer constituting the lower lasing level.

All the barrier layers included in the active layer 12 preferably have a thickness of 6.5 nm or less. This inhibits an excessive increase in the thickness of each active layer unit, and thus lasing can be caused at a low threshold value. In each active layer unit, the barrier layers may have the same thickness or different thicknesses.

The number of active layer units in the active layer 12 is not particularly limited. The number of the quantum well layers and the number of the barrier layers in each of the active layer units are not particularly limited. The thickness of the active layer 12 is preferably 0.5 μm or more and 100 μm or less and more preferably 1 μm or more and 20 μm or less.

Suitable Structure of Active Layer

A suitable structure of the active layer 12 will be described below. The active layer 12 includes many active layer units stacked on top of each other. FIG. 5 illustrates a conduction band of the active layer units and a wave function determined by simulation. In this simulation, a single-band Hamiltonian was assumed as an electron Hamiltonian, and Schrödinger's equation and Poisson's equation were solved by a self-consistent calculation method. Thus, the potential energy and wave function of electrons obtained when a bias voltage of about 95 meV per active layer unit was applied were calculated.

In FIG. 5, the horizontal axis shows a position in the active layer in a thickness direction and the vertical axis shows the potential energy of electrons. "One period" enclosed in a dotted line corresponds to a single active layer unit. L201 to L208 show energy levels (calculated results). In each of L201 to L208, the value on the vertical axis is the potential energy of electrons and the shape corresponds to a shape of the wave function. Furthermore, L210 shows an energy band structure (calculated results) of the active layer.

In the simulation, a structure formed by connecting many active layer units was used as a structure of the active layer by applying periodic boundary conditions to a one-period active layer unit (a single active layer unit). The one-period active layer unit includes three quantum well layers and three barrier layers, and each of the quantum well layers and each of the barrier layers are alternately stacked. The composition and thickness of each of the quantum well layers and the composition and thickness of each of the barrier layers are as follows. The "first layer" described later is a leftmost layer in the region enclosed in a dotted line in FIG. 5. The "sixth layer" described later is a rightmost layer in the region enclosed in a dotted line in FIG. 5 and contains Si in a concentration of $3 \times 10^{17}/cm^3$ in order to generate electrons.

First layer (barrier layer): $Al_{0.2}Ga_{0.8}N$ (thickness: 2.0 nm)
Second layer (quantum well layer): GaN (thickness: 3.5 nm)
Third layer (barrier layer): $Al_{0.2}Ga_{0.8}N$ (thickness: 2.0 nm)
Fourth layer (quantum well layer): GaN (thickness: 3.0 nm)
Fifth layer (barrier layer): $Al_{0.2}Ga_{0.8}N$ (thickness: 3.0 nm)
Sixth layer (quantum well layer): GaN (thickness: 6.0 nm)

As illustrated in FIG. 5, the active layer unit included in the region enclosed in a dotted line formed the energy levels L203 to L208. The energy levels L203 and L204 are upper lasing levels, the energy levels L205 and L206 are lower lasing levels, and the energy levels L207 and L208 are carrier-extraction levels. The energy levels L201 and L202 are carrier-extraction levels in an active layer unit located on the left side of the active layer unit included in the region enclosed in a dotted line in FIG. 5.

When carriers are injected into the energy levels L203 and L204 from the active layer unit located on the left side of the active layer unit included in the region enclosed in a dotted line in FIG. 5, the carriers are subjected to stimulated emission from the energy levels L203 and L204 toward the energy levels L205 and L206 (radiative transition). Then, the carriers reach the sixth layer (quantum well layer) by tunneling and are scattered by LO phonons (the vibrational energy of LO phonons of GaN is 92 meV) to cause transition to the energy levels L207 and L208. The carriers subjected to the transition to the energy levels L207 and L208 are injected into an active layer unit located on the right side of the active layer unit included in the region enclosed in a dotted line in FIG. 5. The above-described processes are repeatedly conducted.

As illustrated in FIG. 5, the second layer forms the upper lasing level and the fourth layer forms the lower lasing level. Herein, the third layer located between the second layer and the fourth layer has a thickness of 2.0 nm. This suppresses the nonradiative transition from the upper lasing level to the lower lasing level due to elastic scattering such as impurity scattering or roughness scattering. It has been found from the calculation conducted by the present inventors that such an effect is considerably produced when the barrier layer disposed between the quantum well layer that forms the upper lasing level and the quantum well layer that forms the lower lasing level has a thickness of 1.8 nm or more. This is because a thickness of 1.8 nm or more of the barrier layer sharply weakens the bond between the quantum well layer that forms the upper lasing level and the quantum well layer that forms the lower lasing level. In other words, the overlap between the wave function of the upper lasing level and the wave function of the lower lasing level decreases (FIG. 5).

Figure 6:
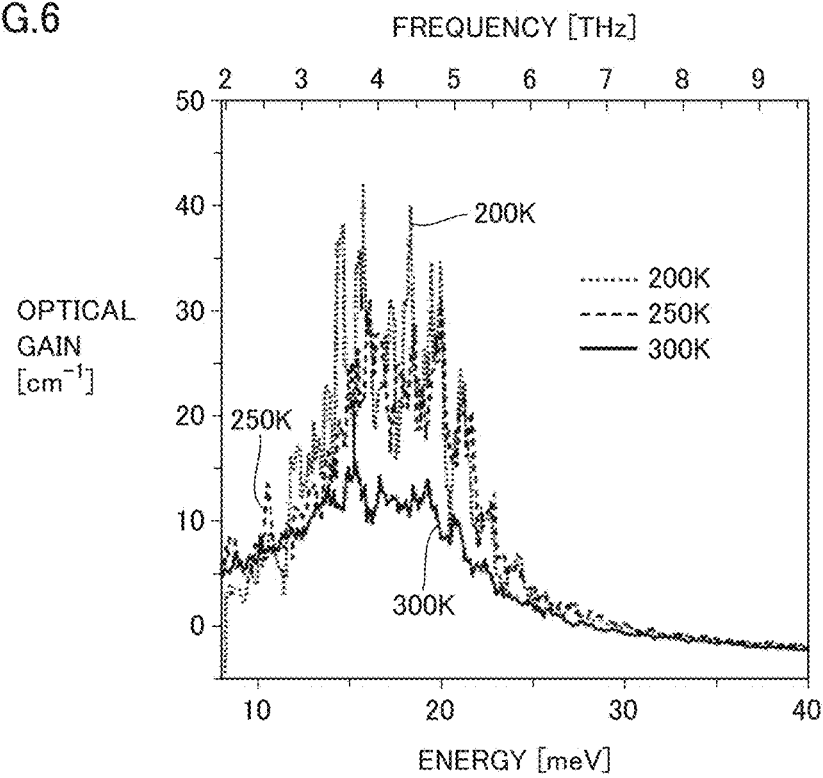
FIG. 6 is a graph illustrating the optical gain obtained when a bias voltage of about 95 meV per active layer unit is applied, the optical gain being calculated by a nonequilibrium Green's function method.

FIG. 6 is a graph illustrating the optical gain obtained when a bias voltage of about 95 meV per active layer unit was applied, the optical gain being calculated by a nonequilibrium Green's function method. In FIG. 6, the vertical axis shows an optical gain ($cm^{-1}$), the horizontal axis on the upper side shows a frequency (THz), and the horizontal axis on the lower side shows energy (meV). It is clear from the results that even when a QCL including the above-described active layer units is operated at 300 K, optical gain is obtained in a wide frequency range of 2.5 to 6 THz. In particular, in a frequency range of 3.2 to 4.8 THz, the optical gain exceeds 10 $cm^{-1}$ and the maximum optical gain is about 15 $cm^{-1}$. Thus, it has been found that the QCL including the above-described active layer units has optical gain sufficient for lasing at room temperature.

In the QCL according to an embodiment of the present disclosure, the percentage difference between the c-axis lattice constant or the a-axis lattice constant of the barrier layer and the c-axis lattice constant or the a-axis lattice constant of the second intermediate layer may be 0.3% or less. Thus, strain present inside the barrier layer can be suppressed.

First Contact Layer

The first contact layer 16 is made of a compound semiconductor. The compound semiconductor is preferably represented by general formula $Al_{c1}In_{d1}Ga_{(1-c1-d1)}N$, $0 \leq c1 \leq 1$, $0 \leq d1 \leq 1$ and is more preferably a material having a lattice constant close to the lattice constant of the material used for the barrier layer.

The first contact layer 16 may contain an n-type dopant (e.g., Si). This decreases the resistance of the first contact layer 16 itself and also decreases the contact resistance between the first contact layer 16 and the lower electrode 15. The n-type dopant concentration in the first contact layer 16 is preferably $1 \times 10^{17}/cm^3$ or more and $1 \times 10^{20}/cm^3$ or less and more preferably $1 \times 10^{18}/cm^3$ or more and $5 \times 10^{19}/cm^3$ or less.

The thickness of the first contact layer 16 is preferably 0.05 µm or more and 3 µm or less and more preferably 0.1 µm or more and 1 µm or less.

Second Contact Layer

The second contact layer 13 is made of a compound semiconductor. The compound semiconductor is preferably represented by general formula $Al_{c2}In_{d2}Ga_{(1-c2-d2)}N$, $0 \leq c2 \leq 1$, $0 \leq d2 \leq 1$ and is more preferably a material having a lattice constant close to the lattice constant of the material used for the barrier layer.

The second contact layer 13 may contain an n-type dopant (e.g., Si). This decreases the resistance of the second contact layer 13 itself and also decreases the contact resistance between the second contact layer 13 and the upper electrode 14. The n-type dopant concentration in the second contact layer 13 is preferably $1 \times 10^{17}/cm^3$ or more and $1 \times 10^{20}/cm^3$ or less and more preferably $1 \times 10^{18}/cm^3$ or more and $5 \times 10^{19}/cm^3$ or less.

The thickness of the second contact layer 13 is preferably 0.05 µm or more and 3 µm or less and more preferably 0.1 µm or more and 1 µm or less.

Upper Electrode and Lower Electrode

The upper electrode 14 may be made of a metal material having good ohmic characteristics with the second contact layer 13. The upper electrode 14 is, for example, an ohmic electrode including Ti layers and Al layers stacked on top of each other. The upper electrode 14 may be made of a metal different from Ti and Al or may be a transparent oxide electrode.

The lower electrode 15 may be made of a metal material having good ohmic characteristics with the first contact layer 16. The lower electrode 15 is, for example, an ohmic electrode including Ti layers and Al layers stacked on top of each other. The lower electrode 15 may be made of a metal different from Ti and Al or may be a transparent oxide electrode.

Production of QCL

First, a first intermediate layer 101, a second intermediate layer 102, an active layer 12, and a second contact layer 13 are formed on the upper surface of the substrate 11 by, for example, a molecular beam epitaxy (MBE) method or a metal organic vapor phase epitaxy (MOVPE) method. Then, the second contact layer 13, the active layer 12, and a part of the first contact layer 16 are etched by, for example, a reactive ion etching (RIE) method to form a mesa shape illustrated in FIG. 1. Then, an upper electrode 14 is formed on the upper surface of the second contact layer 13 and a lower electrode 15 is formed in an exposed portion of the first contact layer 16 by, for example, an electron-beam deposition method and a photolithography process. Thus, a QCL 10 in FIG. 1 is produced.

Crystal Growth by MOVPE

A growth method for an epitaxial wafer of the QCL 10 by MOVPE will be described below. First, an m-plane GaN single crystal substrate 11 is surface-treated. This surface treatment is a surface planarizing treatment described below. The m-plane GaN single crystal substrate 11 is inserted into a growth chamber and surface cleaning treatment is performed. In the surface cleaning treatment, specifically, the m-plane GaN substrate is heated in a hydrogen atmosphere at 1000° C. for 10 to 60 minutes to remove an organic material and the like.

The growth temperature is, for example, 1000° C. to 1100° C. and the raw material gases are trimethylgallium (TMG), trimethylaluminum (TMA), trimethylindium (TMI), and ammonia. The first intermediate layer 101, the second intermediate layer 102, the first contact layer 16, the active layer 12, and the second contact layer 13 can be sequentially formed by optimizing the growth temperature and the ratio of the raw material gases for formation of each layer.

When the first contact layer 16, the second contact layer 13, and a part of the active layer are grown, each of the layers can be made to have n-type conductivity by adding silane gas ($SiH_4$) to the raw material gases and supplying the raw material gases.

Crystal Growth by MBE

A growth method for an epitaxial wafer of the QCL 10 by MBE will be described below. First, an m-plane GaN single crystal substrate 11 is surface-treated. This surface treatment is a surface planarizing treatment described below. The m-plane GaN single crystal substrate 11 is inserted into a growth chamber and surface cleaning treatment is performed. In the surface cleaning treatment, specifically, the m-plane GaN substrate is heated at about 800° C. for 10 to 60 minutes to remove an organic material and the like.

The growth temperature is, for example, 700° C. to 800° C. and the raw materials are Ga, Al, In, and nitrogen plasma (N) that are adjusted to a desired cell temperature. The first intermediate layer 101, the second intermediate layer 102, the first contact layer 16, the active layer 12, and the second contact layer 13 can be sequentially formed by optimizing the growth temperature and supplying the optimum raw materials for formation of each layer.

When the first contact layer 16, the second contact layer 13, and a part of the active layer are grown, each of the layers can be made to have n-type conductivity by supplying silicon (Si).

In the above process, nitrogen plasma conditions are as follows. For example, a plasma power of 300 to 500 W and a nitrogen gas ($N_2$) flow rate of 1.0 to 5.0 sccm (standard cc/min) can be employed.

Through the above processes, an epitaxial wafer of the QCL 10 is formed.

Downstream Process

The epitaxial wafer formed as described above is taken out of the growth chamber. Selective etching is performed from the second contact layer 13 to expose the surface of the first contact layer 16. A lower electrode 15 and an upper electrode 14 are deposited on the exposed surface of the first contact layer 16 and the surface of the second contact layer 13 by electron-beam deposition or the like, respectively.

Subsequently, the bottom surface of the substrate 11 is polished with a polishing machine so as to have a thickness of 80 μm. The wafer is then placed on a table of a scriber, and a scribe line is formed. After the formation of the scribe line, the wafer is cleaved under pressure using a roller to obtain laser bars having cleaved surfaces.

Subsequently, reflectors (not illustrated) formed of a dielectric multilayer film are formed on the cleaved surfaces of each of the laser bars using a chemical vapor deposition (CVD) apparatus to form a resonance surface. Furthermore, a portion of the bar on the substrate side is scribed at a position parallel to the electrode, and the bar is cleaved (e.g., resonator length: 2 mm, width: 500 μm) to produce a QCL 10.

Second Embodiment

A QCL according to a second embodiment will be described. A first intermediate layer of the QCL according to the second embodiment has a composition different from that of the first intermediate layer 101 of the QCL 10 according to the first embodiment. In the above-described one-period active layer unit, the total thickness of the quantum well layers is 12.5 nm and the total thickness of the barrier layers is 7.0 nm. Herein, the average Al content per one-period active layer unit is given by the following formula.

(Average Al content)=[(0×12.5)+(0.2×7.0)]/ 19.5=0.0718

When the Al content in a portion of the first intermediate layer on the side opposite to the substrate (a near-surface portion of the first intermediate layer on the second intermediate layer side) is set to about 0.0718 and the Al content of the second intermediate layer is set to about 0.0718, strain present inside the active layer can be suppressed. The average Al content corresponds to an average lattice constant per one-period active layer unit, and can also be calculated from [(Total thickness of quantum well layers)×(c-axis lattice constant or a-axis lattice constant of quantum well layers)+(Total thickness of barrier layers)×(c-axis lattice constant or a-axis lattice constant of barrier layers)]/ (Total thickness of one-period active layer unit). In particular, when both In and Al are contained in the active layer, the average lattice constant needs to be calculated. If the percentage difference between the average lattice constant per one-period active layer unit and the a-axis lattice constant or c-axis lattice constant in a portion of the first intermediate layer on the side opposite to the substrate (a near-surface portion of the first intermediate layer on the second intermediate layer side) is 0.3% or less, strain can be suppressed.

Third Embodiment

A QCL according to a third embodiment will be described. The QCL according to the third embodiment is different from the QCL according to the second embodiment in that the Al content of the first intermediate layer and the second intermediate layer is determined so as to match not only the average lattice constant of the active layer but also the average lattice constant of all the layers stacked on the second intermediate layer.

First contact layer: $Al_{0.2}Ga_{0.8}N$ (thickness: 300.0 nm)
Active layer (200 periods in total)
First layer (barrier layer): $Al_{0.2}Ga_{0.8}N$ (thickness: 2.0 nm)
Second layer (quantum well layer): GaN (thickness: 3.5 nm)
Third layer (barrier layer): $Al_{0.2}Ga_{0.8}N$ (thickness: 2.0 nm)
Fourth layer (quantum well layer): GaN (thickness: 3.0 nm)
Fifth layer (barrier layer): $Al_{0.2}Ga_{0.8}N$ (thickness: 3.0 nm)
Sixth layer (quantum well layer): GaN (thickness: 6.0 nm)
Second contact layer: $Al_{0.2}Ga_{0.8}N$ (thickness: 300.0 nm)

When the composition and thickness of each layer are determined as above, the average lattice constant calculated from [Total of (thickness)×(lattice constant) of the layers/ Total of thicknesses] is a value corresponding to $Al_{0.088}Ga_{0.912}N$. Therefore, when the Al content in a portion of the first intermediate layer on the side opposite to the substrate (a near-surface portion of the first intermediate layer on the second intermediate layer side) is set to about 0.088 and the Al content of the second intermediate layer is set to about 0.088, strain can be suppressed in all the first contact layer, the active layer, and the second contact layer. If the percentage difference between the average lattice constant of all the layers stacked on the second intermediate layer and the a-axis lattice constant or the c-axis lattice constant in a portion of the first intermediate layer on the side opposite to the substrate (a near-surface portion of the first intermediate layer on the second intermediate layer side) is 0.3% or less, strain can be suppressed.

Fourth Embodiment

A QCL 20 according to a fourth embodiment of the present disclosure will be described. In the following description, the parts that play the same role as those of the first embodiment are denoted by the same reference numerals, and the description thereof is omitted.

Figure 7:
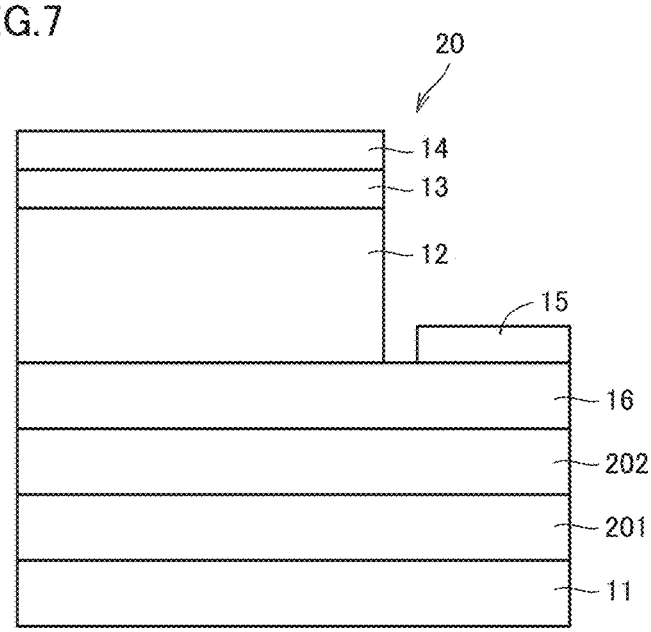
FIG. 7 is a sectional view of a QCL according to a fourth embodiment of the present disclosure.

FIG. 7 is a sectional view of a QCL 20 according to the fourth embodiment of the present disclosure. The QCL 20 includes a substrate 11, a first intermediate layer 201 disposed on the upper surface of the substrate 11, a second intermediate layer 202 disposed on the upper surface of the first intermediate layer 201, a first contact layer 16 disposed on the upper surface of the second intermediate layer 202, an active layer 12 disposed on the first contact layer 16, a second contact layer 13 disposed on the upper surface of the active layer 12, an upper electrode (second electrode) 14 in contact with the upper surface of the second contact layer 13, and a lower electrode 15 disposed on the first contact layer 16 in a position different from that of the active layer 12. The active layer 12 includes two or more active layer units stacked on top of each other. Each of the active layer units includes one or more quantum well layers and one or more barrier layers, and each of the quantum well layers and each of the barrier layers are alternately stacked.

First Intermediate Layer

In the QCL 20 according to the fourth embodiment, the first intermediate layer 201 is made of a compound semiconductor. The first intermediate layer 201 may be a layer in which the Al content z2 of a compound semiconductor represented by general formula $Al_{z2}Ga_{(1-z2)}N$, $0 \leq z2 \leq 1$ changes in a gradient manner. The Al content z2 of the first intermediate layer 201 on the substrate 11 side is minimum, and the Al content z2 gradually increases as the distance from the substrate 11 increases. The Al content z2 may be continuously increased or AlGaN layers having a particular Al content may be stacked so that the Al content is gradually increased.

The role of the first intermediate layer 201 in the QCL 20 according to the fourth embodiment will be described. When AlGaN is directly grown on the GaN substrate 11, first, AlGaN is grown in a strained state in accordance with the lattice constant of GaN. The strain becomes larger as the thickness of the AlGaN layer increases. When the strain reaches its limit, defects are introduced, which causes lattice relaxation. It has been found from the experiment conducted by the present inventors that when growth is performed so that the Al content increases in a gradient manner from the composition close to (the same as) that of a GaN substrate as in the case of the first intermediate layer 201 in the QCL 20 according to the fourth embodiment, the strain increases as the thickness increases and relaxation occurs as a result of formation of cracks. It has been also found that formation of cracks in a direction inclined about 30° from the c-plane simultaneously causes relaxation in the a-axis direction. The cracks are formed only in a direction of the c-plane (parallel to the a-axis) or a direction inclined about ±30° from the c-plane.

The first intermediate layer 201 in the QCL 20 according to the fourth embodiment may have an Al content of 0 or more and 0.05 or less on the substrate 11 side (in a near-surface portion of the first intermediate layer 201 on the substrate 11 side). As a result of the formation of the first intermediate layer 201 in such a manner, the lattice constant of the substrate 11 is substantially continuous with the lattice constant of the first intermediate layer 201, which suppresses the formation of minute defects.

The percentage difference between the Al content in a portion of the first intermediate layer 201 in the QCL 20 according to the fourth embodiment on the side opposite to the substrate 11 (in a near-surface portion of the first intermediate layer 201 on the second intermediate layer 202 side) and the Al content of the second intermediate layer 202 is preferably ±1% and more preferably ±0.5%. By forming the first intermediate layer 201 and the second intermediate layer 202 in such a manner, the strain inside the second intermediate layer 202 can be suppressed.

Specifically, in the QCL 20, the Al content z2 in a portion of the first intermediate layer made of $Al_{z2}Ga_{(1-z2)}N$ on the substrate side is 0, that is, the portion of the first intermediate layer is made of GaN. The Al content z2 in a portion of the first intermediate layer made of $Al_{z2}Ga_{(1-z2)}N$ on the side opposite to the substrate is 0.2, that is, the portion of the first intermediate layer is made of $Al_{0.2}Ga_{0.8}N$.

The thickness of the first intermediate layer 201 in the fourth embodiment may be 1 μm or more because formation of cracks can be induced by gradually putting strain.

Second Intermediate Layer

The second intermediate layer 202 in the QCL 20 according to the fourth embodiment is made of a compound semiconductor. The compound semiconductor is preferably represented by general formula $Al_{x2}In_{y2}Ga_{(1-x2-y2)}N$, $0 \leq x2 \leq 1$, $0 \leq y2 \leq 1$ and more preferably has a lattice constant substantially equal to the lattice constant in a near-surface portion of the first intermediate layer 201 that is in contact with the second intermediate layer 202. For example, when the composition of a portion of the first intermediate layer 201 near the second intermediate layer 202 is $Al_{0.2}Ga_{0.8}N$, the second intermediate layer 202 is determined so as to have a lattice constant that preferably satisfies $Al_{0.19}Ga_{0.81}N$ to $Al_{0.21}Ga_{0.79}N$ and most preferably $Al_{0.2}Ga_{0.8}N$.

The second intermediate layer 102 plays a role of covering the cracks formed in the first intermediate layer 101 to planarize the surface. Therefore, the second intermediate layer 102 has a thickness sufficient for completely covering the cracks.

Figure 8:
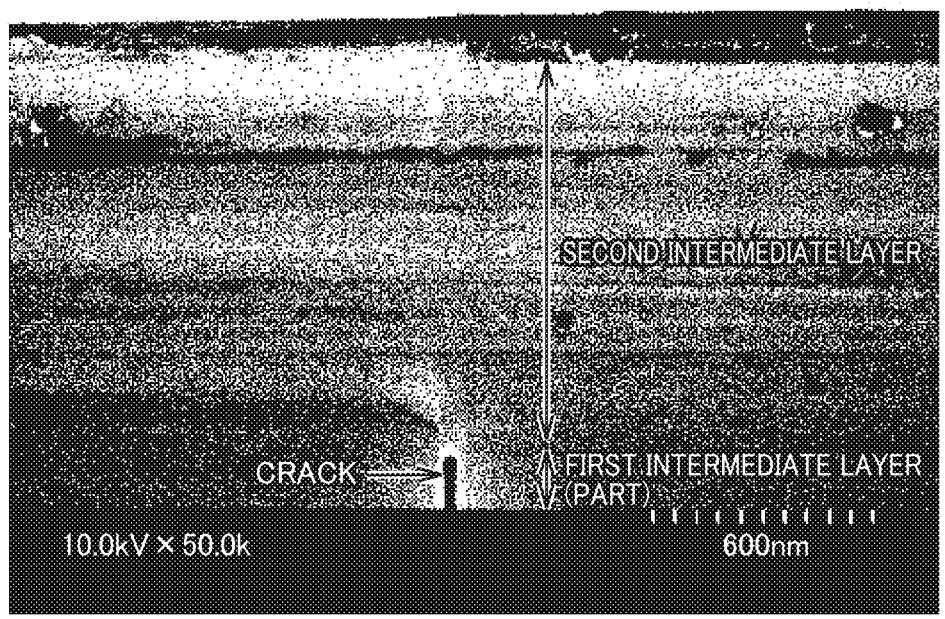
FIG. 8 is an electron microscope image illustrating the cross-section of the first intermediate layer and the second intermediate layer in the fourth embodiment.

FIG. 8 is an electron microscope image illustrating the cross-section of the first intermediate layer 201 and the second intermediate layer 202 in the fourth embodiment. The first intermediate layer 201 is formed on an m-plane GaN substrate. The Al content z2 of the first intermediate layer 201 on the m-plane GaN substrate side is 0.0 (GaN). The Al content z2 linearly increases as the thickness increases. The Al content z2 reaches 0.2 ($Al_{0.2}Ga_{0.8}N$) at the boundary between the first intermediate layer 201 and the second intermediate layer 202. In the experiment whose result is shown in FIG. 8, the thickness of the first intermediate layer 201 is 1.1 μm. The second intermediate layer 202 is subsequently grown with a thickness of about 1.2 μm so that the Al content x2 is 0.2 and the In content y2 is 0 ($Al_{0.2}Ga_{0.8}N$). As is clear from FIG. 8, a hole resulting from a crack is present in the first intermediate layer 201, but the hole is covered by the second intermediate layer 202 and thus a flat surface is formed.

Fifth Embodiment

A QCL according to a fifth embodiment will be described. The first intermediate layer in the QCL according to the fifth embodiment has a composition different from that of the first intermediate layer 201 in the QCL 20 according to the fourth embodiment. In the above-described one-period active layer unit, the total thickness of the quantum well layers is 12.5 nm and the total thickness of the barrier layers is 7.0 nm. The average Al content per one-period active layer unit is given by the following formula.

(Average Al content)=[(0×12.5)+(0.2×7.0)]/19.5=0.0718

When the Al content in a portion of the first intermediate layer on the side opposite to the substrate side (a near-surface portion of the first intermediate layer on the second intermediate layer side) is set to about 0.0718 and the Al content of the second intermediate layer is set to about 0.0718, strain present inside the active layer can be suppressed. The average Al content corresponds to an average lattice constant per one-period active layer unit, and can also be calculated from [(Total thickness of quantum well layers)×(c-axis lattice constant or a-axis lattice constant of quantum well layers)+(Total thickness of barrier layers)×(c- axis lattice constant or a-axis lattice constant of barrier layers)]/(Total thickness of one-period active layer unit). In particular, when both In and Al are contained in the active layer, the average lattice constant needs to be calculated. If the percentage difference between the average lattice constant per one-period active layer unit and the a-axis lattice constant or c-axis lattice constant in a portion of the first intermediate layer on the side opposite to the substrate (a near-surface portion of the first intermediate layer on the second intermediate layer side) is 0.3% or less, strain can be suppressed.

Sixth Embodiment

A QCL according to a sixth embodiment will be described. The QCL according to the sixth embodiment is different from the QCL according to the fifth embodiment in that the Al content of the first intermediate layer and the second intermediate layer is determined so as to match not only the average lattice constant of the active layer but also the average lattice constant of all the layers stacked on the second intermediate layer.

First contact layer: $Al_{0.2}Ga_{0.8}N$ (thickness: 300.0 nm)
Active layer (200 periods in total)
First layer (barrier layer): $Al_{0.2}Ga_{0.8}N$ (thickness: 2.0 nm)
Second layer (quantum well layer): GaN (thickness: 3.5 nm)
Third layer (barrier layer): $Al_{0.2}Ga_{0.8}N$ (thickness: 2.0 nm)
Fourth layer (quantum well layer): GaN (thickness: 3.0 nm)
Fifth layer (barrier layer): $Al_{0.2}Ga_{0.8}N$ (thickness: 3.0 nm)
Sixth layer (quantum well layer): GaN (thickness: 6.0 nm)
Second contact layer: $Al_{0.2}Ga_{0.8}N$ (thickness: 300.0 nm)

When the composition and thickness of each layer are determined as above, the average lattice constant calculated from [Total of (thickness)×(lattice constant) of the layers/Total of thicknesses] is a value corresponding to $Al_{0.088}Ga_{0.912}N$. Therefore, when the Al content in a portion of the first intermediate layer on the side opposite to the substrate (a near-surface portion of the first intermediate layer on the second intermediate layer side) is set to about 0.088 and the Al content of the second intermediate layer is set to about 0.088, strain can be suppressed in all the first contact layer, the active layer, and the second contact layer. If the percentage difference between the average lattice constant of all the layers stacked on the second intermediate layer and the a-axis lattice constant or the c-axis lattice constant in a portion of the first intermediate layer near the second intermediate layer is 0.3% or less, strain can be suppressed.

The present disclosure contains subject matter related to that disclosed in Japanese Priority Patent Application JP 2016-004333 filed in the Japan Patent Office on Jan. 13, 2016, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nitride semiconductor device comprising:
a GaN substrate in which an angle between a principal surface and an m-plane of GaN is −5° or more and +5° or less;
a first intermediate layer disposed on the principal surface of the substrate and made of $Al_zGa_{(1-z)}N$, $0 \leq z \leq 1$;
a second intermediate layer disposed on a principal surface of the first intermediate layer, having an Al content different from that of the first intermediate layer, and made of $Al_{x1}In_{y1}Ga_{(1-x1-y1)}N$, $0 \leq x1 \leq 1$, $0 \leq y1 \leq 1$;
an active layer that includes a quantum well layer and a barrier layer and is disposed on the second intermediate layer on a side opposite to the substrate; wherein
a percentage difference between a c-axis lattice constant or an a-axis lattice constant of the barrier layer and a c-axis lattice constant or an a-axis lattice constant of the second intermediate layer is 0.3% or less.

2. The nitride semiconductor device according to claim 1, wherein the first intermediate layer has a higher Al content than the second intermediate layer.

3. The nitride semiconductor device according to claim 1, wherein the first intermediate layer is an AlN layer.

4. The nitride semiconductor device according to claim 1, wherein the first intermediate layer has a smaller thickness than the second intermediate layer.

5. The nitride semiconductor device according to claim 4, wherein the first intermediate layer has a thickness of 100 nm or less.

6. The nitride semiconductor device according to claim 5, wherein the first intermediate layer has a thickness of 5 nm or more and 40 nm or less.

7. The nitride semiconductor device according to claim 1, wherein the Al content of the first intermediate layer increases in a gradient manner as a distance between the first intermediate layer and the substrate increases, and the second intermediate layer has a substantially constant Al content.

8. The nitride semiconductor device according to claim 7, wherein an Al content in a portion of the first intermediate layer on the substrate side is 0 or more and 0.05 or less.

9. The nitride semiconductor device according to claim 7, wherein a percentage difference between an Al content in a portion of the first intermediate layer on a side opposite to the substrate and the Al content of the second intermediate layer is ±1%.

10. The nitride semiconductor device according to claim 7, wherein the first intermediate layer has a thickness of 1 μm or more.

11. The nitride semiconductor device according to claim 1,
wherein the active layer includes one or more of the quantum well layers and one or more of the barrier layers, and
a percentage difference between an average lattice constant of the active layer and the c-axis lattice constant or the a-axis lattice constant of the second intermediate layer is 0.3% or less, the average lattice constant being calculated from: a total thickness of the quantum well layers×a c-axis lattice constant or an a-axis lattice constant of the quantum well layers+a total thickness of the barrier layers×a c-axis lattice constant or an a-axis lattice constant of the barrier layers/a total thickness of the quantum well layers and the barrier layers.

12. The nitride semiconductor device according to claim 1, wherein a percentage difference between an a-axis lattice constant or a c-axis lattice constant in a portion of the first intermediate layer on a side opposite to the substrate and an average lattice constant calculated by dividing a total of thickness×c-axis lattice constant or a-axis lattice constant of all layers stacked on the second intermediate layer on a side opposite to the substrate by a total thickness of all the layers stacked on the second intermediate layer on the side opposite to the substrate is 0.3% or less.

13. A quantum cascade laser comprising the nitride semiconductor device according to claim 1.

* * * * *